United States Patent
Miyazaki et al.

(10) Patent No.: US 7,718,474 B2
(45) Date of Patent: May 18, 2010

(54) SEMICONDUCTOR DEVICE AND METHOD OF MANUFACTURING THE SAME

(75) Inventors: Shoichi Miyazaki, Yokkaichi (JP); Hisataka Meguro, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 568 days.

(21) Appl. No.: 11/656,382

(22) Filed: Jan. 23, 2007

(65) Prior Publication Data
US 2007/0187743 A1    Aug. 16, 2007

(30) Foreign Application Priority Data
Jan. 24, 2006   (JP) .............................. 2006-015207

(51) Int. Cl.
*H01L 21/335* (2006.01)
(52) U.S. Cl. ................ 438/142; 438/157; 438/176; 438/283; 257/E21.421
(58) Field of Classification Search ................ 438/142, 438/157, 176, 283; 257/E21.421
See application file for complete search history.

(56) References Cited
U.S. PATENT DOCUMENTS
2004/0238849 A1* 12/2004 Miwa .......................... 257/202
2006/0024956 A1* 2/2006 Zhijian et al. ................ 438/637
2006/0284268 A1* 12/2006 Matsunaga ................... 257/390
2008/0003724 A1* 1/2008 Cho et al. .................... 438/142

FOREIGN PATENT DOCUMENTS
JP    2003-051557    2/2003
JP    2004-356491    12/2004

* cited by examiner

*Primary Examiner*—Thao X Le
*Assistant Examiner*—Elias Ullah
(74) *Attorney, Agent, or Firm*—Finnegan, Henderson, Farabow, Garrett & Dunner, L.L.P.

(57) ABSTRACT

A semiconductor device includes a pair of select gate structures which are opposed to each other and which are formed in a select transistor formation area, each of the select gate structures including a gate insulating film formed on a semiconductor substrate and a gate electrode formed on the gate insulating film, and a pair of memory cell gate structure groups which are formed in a pair of memory cell formation areas between which the select transistor formation area is interposed and each of which has a plurality of memory cell gate structures arranged at the same pitch, the pair of select gate structures having sides which are opposed to each other, and at least the upper portion of each of the opposed sides of the select gate structures being inclined.

15 Claims, 5 Drawing Sheets

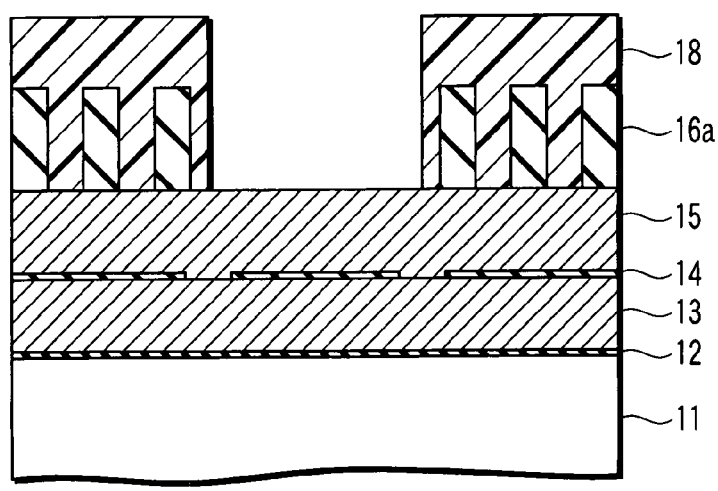
F I G. 6
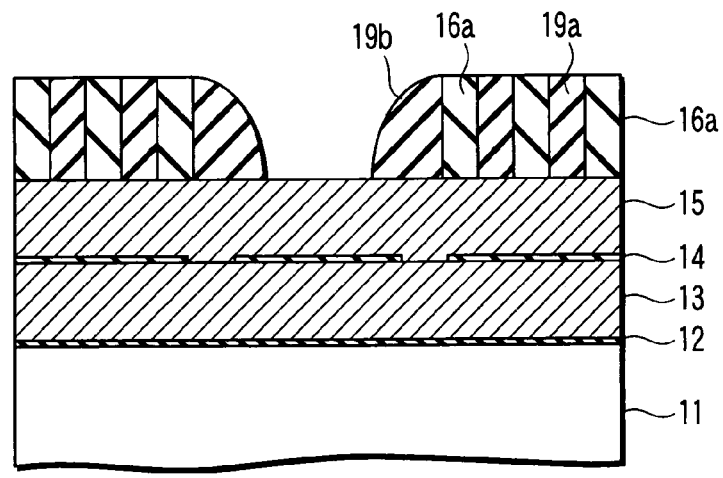
F I G. 7
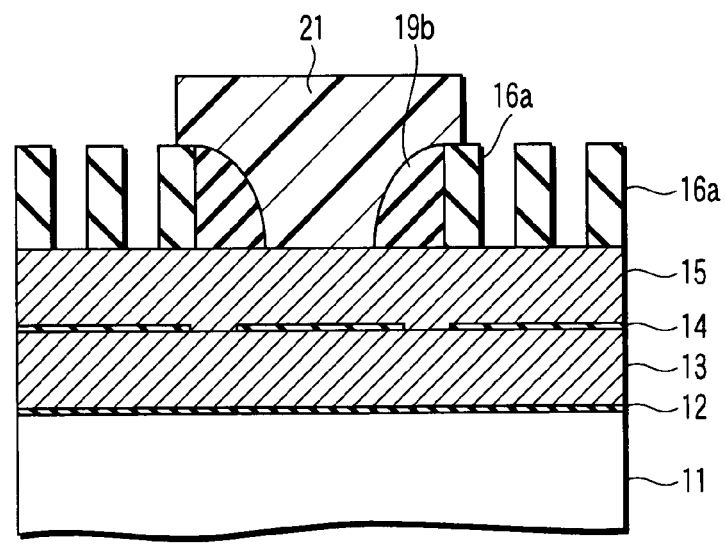
F I G. 8

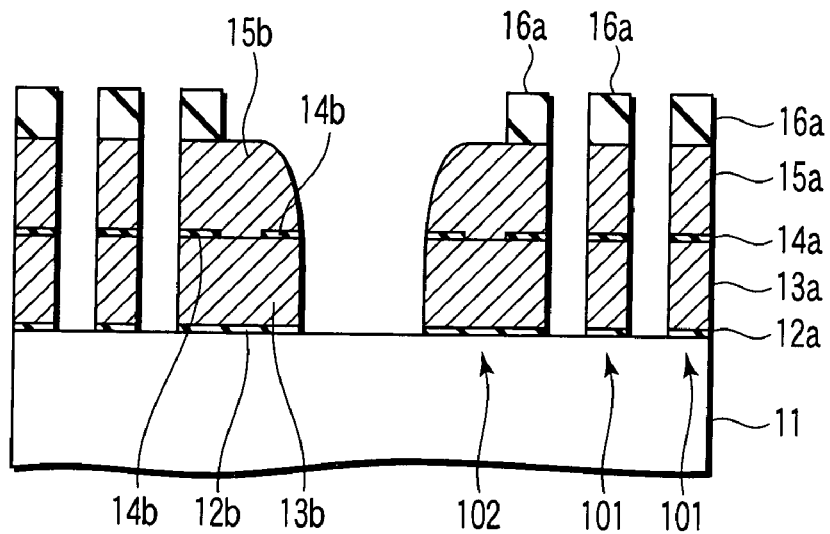
F I G. 9
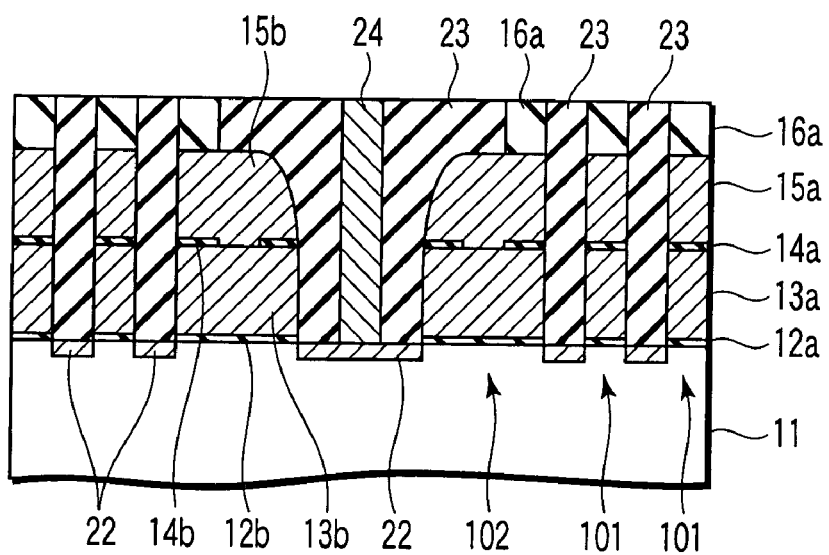
F I G. 10

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2006-015207, filed Jan. 24, 2006, the entire contents of which are incorporated herein by reference.

BACKGROUND OF THE INVENTION

1. Field of the Invention

The present invention relates to a semiconductor device and a method of manufacture thereof.

2. Description of the Related Art

In recent years, NAND type flash memories have been widely used as electrically erasable nonvolatile semiconductor memories. The NAND type flash memory contains a large number of NAND cell units, each of which is configured such that multiple memory cells are connected in series between select transistors. Each of the memory cells has its gate connected to a control gate line (word line) and each of the select transistors has its gate connected to a select gate line.

In the NAND type flash memory, the select gate lines are usually set greater in width than the control gate lines. That is, the control gate lines are arranged at the same pitch, while the select gate lines are arranged at a pitch different from the pitch of the control gate lines. Thus, the select gate lines disturbs the periodicity of line arrangement. As a result, when the dimensions of semiconductor devices are scaled down, the exposure margin in lithographic processes lowers, making it difficult to form patterns for control gate lines and select gate lines with great accuracy. That is, it becomes difficult to form patterns for the gate structures of memory cells and select transistors with great accuracy.

Japanese Unexamined Patent Publication No. 2003-51557 discloses a structure in which one select gate line large in width is replaced with two select gate lines each of which is equal in width to the control gate line. This structure allows the select gate lines to be arranged at the same pitch as the control gate lines. However, since two select gate lines (two select transistors) are used in place of one select gate line (select transistor), there arises a problem of time displacement in operation between the two select transistors.

In the NAND type flash memory, a bit line contact is usually formed in an interlayer insulating film formed between adjacent select transistors. However, when the dimensions of semiconductor devices are scaled down, it becomes difficult to reliably form the interlayer insulating film between the gate structures of adjacent select transistors. That is, voids are easily formed in the interlayer insulating film, making it difficult to perfectly fill the space between the gate structures of adjacent select transistors with the interlayer insulating film.

Thus, conventional problems are that difficulties are involved in forming patterns for the gate structures of memory cells and select transistors with great accuracy and in forming an interlayer insulating film between the gate structures of adjacent select transistors with certainty.

BRIEF SUMMARY OF THE INVENTION

According to a first aspect of the present invention, there is provided a semiconductor device comprising: a pair of select gate structures which are opposed to each other and which are formed in a select transistor formation area, each of the select gate structures including a gate insulating film formed on a semiconductor substrate and a gate electrode formed on the gate insulating film; and a pair of memory cell gate structure groups which are formed in a pair of memory cell formation areas between which the select transistor formation area is interposed and each of which has a plurality of memory cell gate structures arranged at the same pitch, each of the memory cell gate structures including a first gate insulating film formed on the semiconductor substrate, a first gate electrode formed on the first gate insulating film, a second gate insulating film formed on the first gate electrode, and a second gate electrode formed on the second gate insulating film, the pair of select gate structures having sides which are opposed to each other, and at least the upper portion of each of the opposed sides of the select gate structures being inclined.

According to a second aspect of the present invention, there is provided a method of manufacturing a semiconductor device, comprising: forming a stacked structure in which a first gate insulating film, a first gate electrode film, a second gate insulating film and a second gate electrode film are stacked in this order, on a semiconductor substrate; forming a plurality of mask portions on the stacked structure at the same pitch; removing at least one mask portion formed in a predetermined area with mask portions left in areas between which the predetermined area is interposed; forming sidewall portions on the opposed sides of a pair of mask portions which are opposed to each other with the predetermined area interposed therebetween; and etching the stacked structure using the mask portions and the sidewall portions as a mask to form a pair of select gate structures under the pair of mask portions and the sidewall portions and form memory cell gate structures under mask portions other than the pair of mask portions.

BRIEF DESCRIPTION OF THE SEVERAL VIEWS OF THE DRAWING

FIGS. 3 through 10 are schematic sectional views, in the order of steps of manufacture, of the semiconductor device according to the embodiment of the present invention;

DETAILED DESCRIPTION OF THE INVENTION

Embodiments of the present invention will be described hereinafter with reference to the accompanying drawings.

Figure 1:
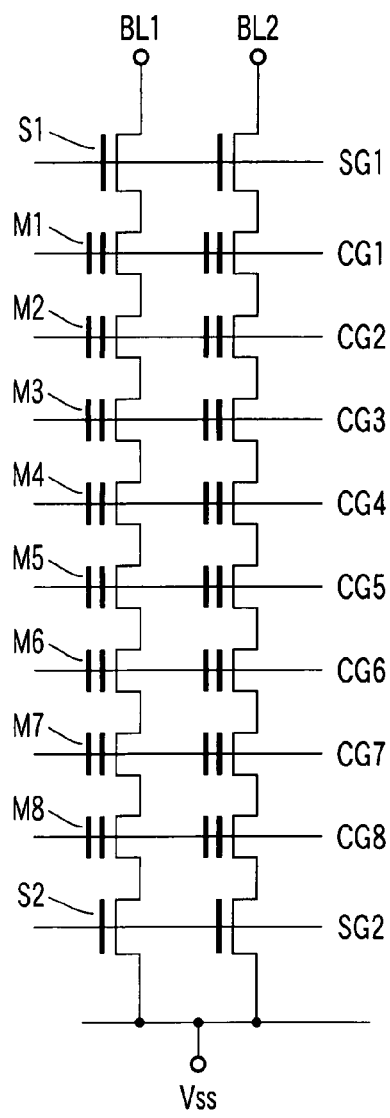
FIG. 1 shows an equivalent circuit of a portion of a semiconductor device according to an embodiment of the present invention.
Figure 2:
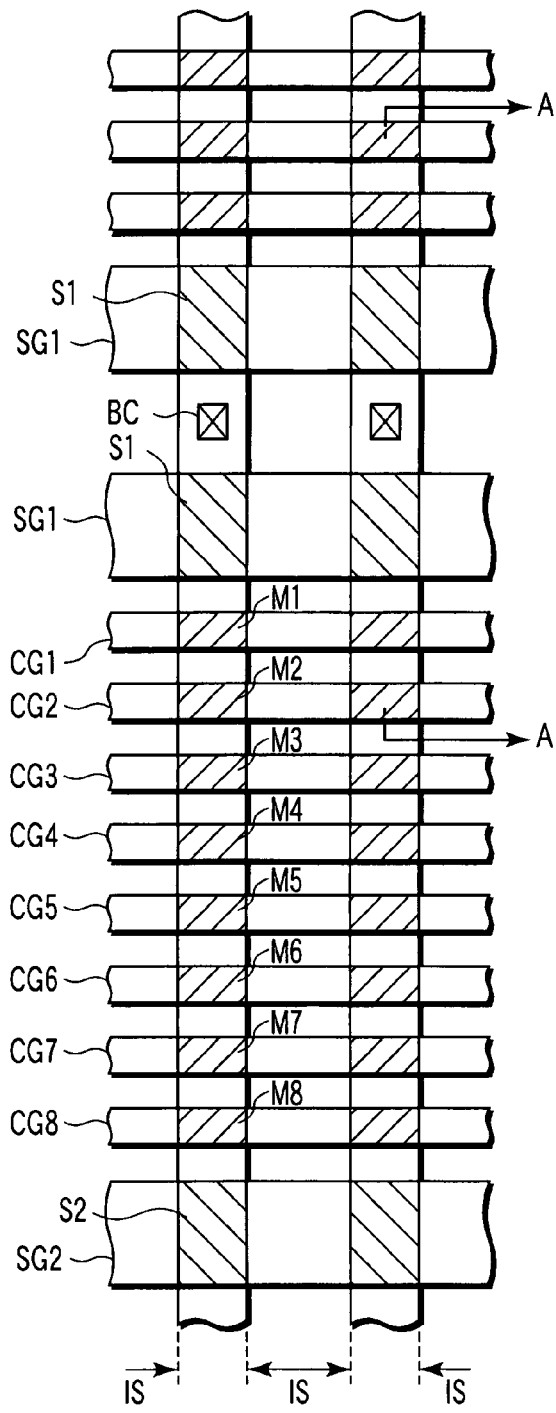
FIG. 2 is a schematic plan view of a portion of the semiconductor device according to the embodiment of the present invention.

FIG. 1 shows an equivalent circuit of a portion of a semiconductor device (NAND type flash memory) according to an embodiment of the present invention. FIG. 2 is a schematic plan view of a portion of the NAND type flash memory corresponding to the portion shown in FIG. 1.

As shown in FIGS. 1 and 2, each of the NAND cell units is configured to have memory cells M1 through M8 connected in series between select transistors S1 and S2. The memory cells M1 through M8 and the select transistors S1 and S2 are formed in an element region. The adjacent element regions are isolated by an isolation region (isolation insulating film) IS.

The select transistors S1 and S2 have their gates connected to select gate lines SG1 and SG2, respectively. The memory cells M1 to M8 have their gates connected to control gate lines (word lines) CG1 to CG8, respectively. The control gate lines CG1 to CG8 are arranged at the same pitch. The select transistors S1 are connected to bit lines BL1 and BL2 via bit line contacts BC. The select transistors S2 are connected to a source line.

FIG. 10 is a schematic sectional view of the NAND type flash memory embodying the present embodiment, which is taken along line A-A (bit line direction) of FIG. 2.

A memory cell formation area are formed with multiple memory cell gate structures 101 which are arranged at the same pitch in correspondence with the memory cells M1 to M8 shown in FIG. 2. In a select transistor formation area between memory cell formation areas are formed a pair of select gate structures 102 which are opposed to each other and correspond to the paired select transistors S1 shown in FIG. 2. The memory cell gate structures 101 and the select gate structures 102 are formed on an element region of a silicon substrate (semiconductor substrate) 11. The width of the select gate structures 102 are made greater than that of the memory cell gate structures 101. The spacing of the select gate structure 102 and the memory cell gate structure 101 which are adjacent to each other is the same as the spacing of the adjacent memory cell gate structures 101.

Each memory cell gate structure 101 is formed from a tunnel insulating film (first gate insulating film) 12a formed on the silicon substrate 11, a floating gate electrode (first gate electrode) 13a formed on the tunnel insulating film 12a, an interelectrode insulating film (second gate insulating film) 14a formed on the floating gate electrode 13a, and a control gate electrode (second gate electrode) 15a formed on the interelectrode insulating film 14a.

The select gate structure 102 has a gate insulating film 12b formed on the silicon substrate 11 and a gate electrode formed on the gate insulating film 12b. The gate electrode is formed of a first gate portion 13b and a second gate portion 15b formed on the first gate portion 13b. Between the first and second gate portions 13b and 15b is formed an insulating portion 14b having a hole through which the first and second gate portions are connected with each other.

The gate insulating film 12b of the select gate structure 102 is formed in the same manufacturing step and by the same material as the tunnel insulating film 12a of the memory cell gate structure 101. The first gate portion 13b of the select gate structure 102 is formed in the same manufacturing step and by the same material as the floating gate electrode 13a of the memory cell gate structure 101. The second gate portion 15b of the select gate structure 102 is formed in the same manufacturing step and by the same material as the control gate electrode 15a of the memory cell gate structure 101. Furthermore, the insulating portion 14b of the select gate structure 102 is also formed in the same manufacturing step and by the same material as the interelectrode insulating film 14a of the memory cell gate structure 101.

As shown in FIG. 10, the paired select gate structures 102 have their respective sides which are opposed to each other formed at least in their upper portions to incline so that their spacing is larger in the upper portions than in the lower portions. That side of each of the select gate structures 102 which is on the opposite side of their opposed sides (i.e., the side opposite the memory cell gate structure 101) is substantially vertical to the major surface of the silicon substrate 11.

In other words, the angle of at least the upper portion of each of the opposed sides of the paired select gate structures relative to the major surface of the silicon substrate is made smaller than the angle of that side of each select gate structure which is opposite the memory cell gate structure relative to the major surface of the silicon substrate.

Impurity diffusion layers 22 serving as sources/drains are formed in the surface region of the silicon substrate 11. Specifically, the impurity diffusion layers 22 are formed in the surface regions between the adjacent memory cell gate structures 101, between the adjacent select gate structures 102, and between the memory cell gate structure 101 and the select gate structure 102.

The memory cell gate structure 101 and the select gate structure 102 are formed on top with mask portions 16a. The mask portions 16a are formed at the same pitch, i.e., at regular intervals.

An interlayer insulating film 23 is formed to fill the spaces between the adjacent memory cell gate structures 101, between the adjacent select gate structures 102, and between the memory cell gate structure 101 and the select gate structure 102. A contact hole is formed in the interlayer insulating film 23 between the select gate structures 102 and a contact plug 24 is formed in that contact hole. This contact plug corresponds to the bit line contact BC shown in FIG. 2. As described above, each of at least the upper portions of the opposed sides of the select gate structures 102 is formed to be inclined; therefore, the space between the select gate structures 102 can be filled easily and reliably with the interlayer insulating film 23.

The method of manufacture of the NAND type flash memory embodying the present invention will be described below with reference to FIGS. 3 through 10, each of which corresponds to a section taken along line A-A of FIG. 2.

Figure 3:
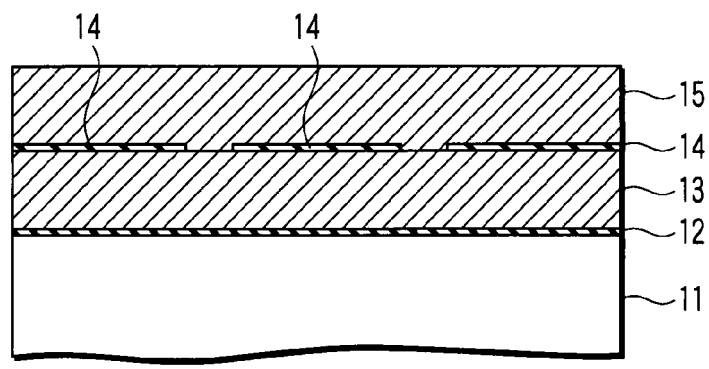

First, as shown in FIG. 3, a p-type silicon substrate (semiconductor substrate) 11 is formed on top with a tunnel insulating film (first gate insulating film) 12 of silicon oxide of a thickness of 10 nm by means of thermal oxidation. Then, a phosphorus-doped polysilicon film is deposited at a thickness of 10 nm onto the surface of the tunnel insulating film 12 by means of LPCVD (low pressure chemical vapor deposition) to form a floating gate electrode film (first gate electrode film) 13.

Next, using a mask pattern which extends in the bit line direction (the direction perpendicular to the word lines) as a mask, the floating gate electrode film 13, the tunnel insulating film 12 and the silicon substrate 11 are etched in sequence. Thereby, element areas and isolation trenches are formed. The tunnel insulating film 12 and the floating gate electrode film 13 are left on the element areas. Further, the isolation trenches are filled with an element isolation insulating film to form isolation regions (not shown).

Next, a composite film of silicon oxide/silicon nitride/silicon oxide (ONO) is formed on the floating gate electrode film 13 and the isolation regions by means of LPCVD to form an interelectrode insulating film (second gate insulating film) 14. Then, portions of the interelectrode insulating film 14 are removed by means of photolithographic and dry etching techniques to form through holes in the film 14.

Next, a phosphorus-doped polysilicon film is deposited onto the interelectrode insulating film 14 by means of LPCVD to form a control gate electrode film (second gate electrode film) 15. At this point, the control gate electrode film 15 is formed in the through holes as well, thereby allowing the floating gate electrode film 13 and the control gate electrode film 15 to come in contact with each other.

Thus, as shown in FIG. 3, a stacked structure of the tunnel insulating film 12, the floating gate electrode film 13, the interelectrode insulating film 14 and the control gate electrode film 15 is formed on the element areas of the semiconductor substrate.

Figure 4:
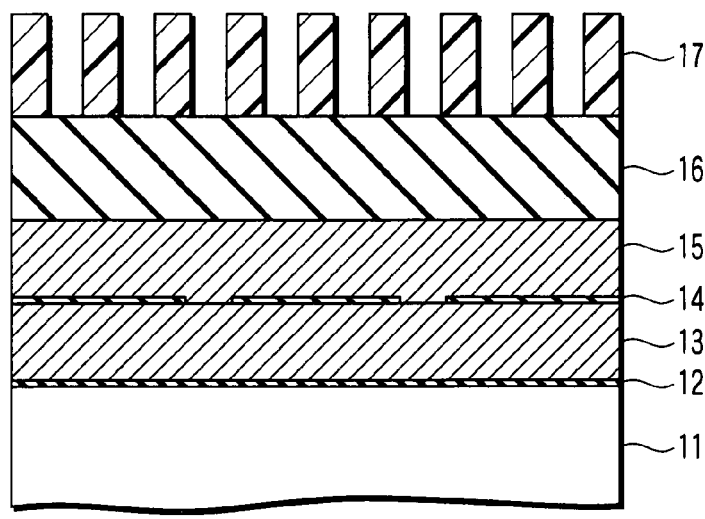

Next, as shown in FIG. 4, a silicon nitride film is formed on the control gate electrode film 15 by means of LPCVD to form a mask film 16. Then, a plurality of photoresist patterns 17 which extend in the word line direction is formed on the mask film 16 by means of photolithographic techniques. These photoresist patterns 17 are formed at the same pitch, thus allowing a sufficient exposure margin to be ensured in the lithographic process.

Figure 5:
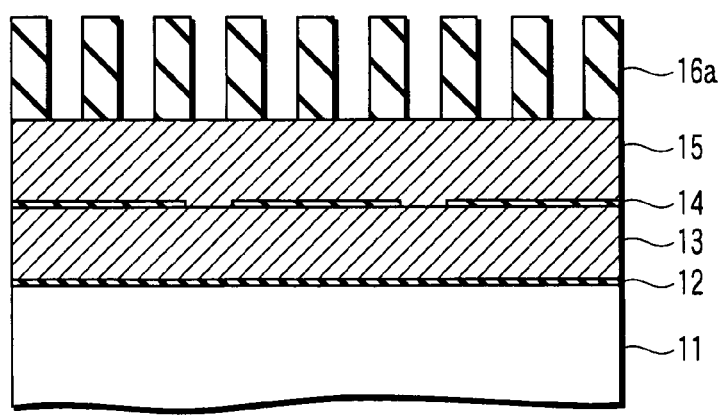

Next, as shown in FIG. 5, using the photoresist patterns 17 as a mask, the mask film 16 is etched by means of dry etching techniques. Thereby, mask portions 16a arranged at the same pitch are formed. Then, the photoresist patterns 17 are removed.

Next, as shown in FIG. 6, a photoresist pattern 18 having an opening in a given area is formed. Then, using the photoresist pattern 18 as a mask, at least one mask portion 16a formed in the given area is removed by hot phosphoric acid. Although, in the example shown in the diagram, three mask portions 16a formed in the given area are removed, the number of mask portions to be removed is determined suitably in view of the width of the select gate structure. The multiple mask portions 16a are left in regions on opposite sides of the given area.

Next, as shown in FIG. 7, after the photoresist pattern 18 has been removed, a silicon oxide film is formed by means of LPCVD to cover the control gate electrode film 15 and the mask portions 16a. The thickness of the covering film is determined suitably in view of the width of the select gate structure. Then, an anisotropic dry etching process is carried out to etch the covering film. In this etching process, a CF-based gas can be used. Thus, the covering film 19b is left on those sides of the paired mask portions 16a which are opposed to each other to form a pair of sidewall portions 19b. The covering film 19a is also left in the area between adjacent mask portions 16a. With the anisotropic dry etching, corner portions (shoulder portions) are easy to be etched. For this reason, the side of the sidewall portion 19b obtained by the anisotropic dry etching will be inclined (curved).

Next, as shown in FIG. 8, a photoresist pattern 21 which covers the sidewall portion 19b is formed using photolithographic techniques. Then, the covering film 19a is etched away by wet etching techniques using the photoresist pattern 21 as a mask.

Next, as shown in FIG. 9, after removal of the photoresist pattern 21, the control gate electrode film 15, the interelectrode insulating film 14, the floating gate electrode film 13 and the tunnel insulating film 12 are subjected to an anisotropic dry etching process using the mask portions 16a and the sidewall portions 19b as a mask. In this anisotropic dry etching, the mask portions 16a and the sidewall portions 19b are etched to some extent and as the result their thickness will decrease. Further, the sidewall portions 19b are removed.

In this way, the memory cell gate structures 101 are formed, each of which is formed from the tunnel insulating film 12a, the floating gate electrode 13a, the interelectrode insulating film 14a, and the control gate electrode 15a. At the same time, the paired select gate structures 102 are formed, each of which is composed of the gate insulating film 12b, the first gate portion 13b, the insulating portion 14b, and the second gate portion 15b. As described previously, with the select gate structures 102, the first gate portion 13b and the second gate portion 15b form a gate electrode. The control gate lines (word lines) are formed at the same time the memory cell gate structures 101 are formed. The select gate lines are formed at the same time the select gate structures 102 are formed.

In the above anisotropic dry etching process, the sidewall portions 19b as well as the mask portions 16a are used as a mask. Since the sidewall portions 19b are also etched to some extent, they regress gradually as etching proceeds. For this reason, the opposed sides of the paired select gate structures 102 are formed into a shape which reflects to some extent the shape of the side of the sidewall portions 19b. As the result, as described previously, at least the upper portions of the opposed sides of the select gate structures 102 will incline. In contrast, the opposite side of each of the select gate structures 102 (the side opposite the memory cell gate structure 101) is substantially vertical to the major surface of the silicon substrate 11.

Next, as shown in FIG. 10, impurities are ion implanted into the silicon substrate 11 using the memory cell gate structures 101 and the select gate structures 102 as a mask. Thereby, impurity diffusion layers 22 for sources/drains are formed.

Next, an interlayer insulating film 23 is formed over the entire surface. Then, the interlayer insulating film 23 is polished and planarized by means of CMP (chemical mechanical polishing) using the mask portions 16a as a CMP stopper. As the result, the space between the adjacent memory cell gate structures 101, the space between the paired select gate structures 102 and the space between the select gate structure 102 and the adjacent memory cell gate structure 101 are filled with the interlayer insulating film 23. Subsequently, a contact hole is formed in the interlayer insulating film 23 between the select gate structures 102 and then a contact plug (bit line contact) 24 is formed in that contact hole by filling the contact hole with conductive material.

The contact hole and the contact plug are formed in the interlayer insulating film 23 between the select gate structures 102; therefore, in order to prevent voids and the like from being formed, it is required to certainly and perfectly fill the space between the select gate structures 102 with the interlayer insulating film 23. In contrast, even if the space between each memory cell gate structure 101 and the space between each select gate structure 102 and the adjacent memory cell gate structure are formed with some voids, there arises no problem. Therefore, these spaces do not need to be perfectly filled with the interlayer insulating film.

Although the subsequent steps are not illustrated, the NAND type flash memory is finished by forming interconnections on the upper layer side.

According to the embodiment described above, as shown in FIGS. 8 and 9, the memory cell gate structures 101 are formed using the mask portions 16a as a mask and the select gate structures 102 are formed using the mask portions 16a and the sidewall portions 19b as a mask. The mask portions 16a are formed at the same pitch as shown in FIGS. 4 and 5. Therefore, the memory cell gate structures 101 and the select gate structures 102 larger in width than the memory cell gate structures can be formed accurately and reliably without lowering the exposure margin in the lithographic process.

With the embodiment, the opposed sides of the paired select gate structures 102 can be inclined by inclining the sides of the respective sidewall portions 19b. As the result, the interlayer insulating film 23 can be formed easily and reliably between the paired select gate structures 102, which will ensure that the contact plug 24 which is excellent in reliability is formed in the interlayer insulating film 23 between the select gate structures 102.

According to the embodiment, therefore, a NAND type flash memory can be formed which is excellent in pattern accuracy and reliability.

The aforementioned embodiment can be practiced in the following modified forms.

Figure 11:
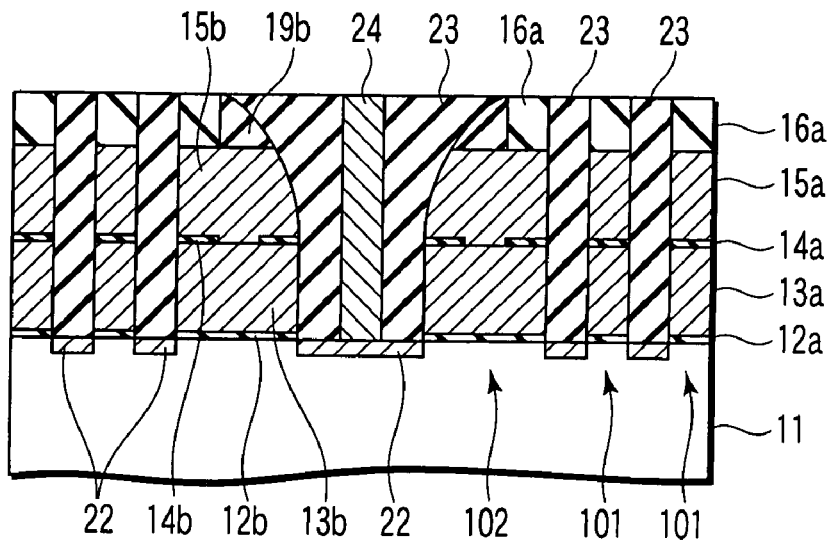
FIG. 11 is a schematic sectional view of a semiconductor device according to a first modification of the embodiment of the present invention.

FIG. 11 is a schematic sectional view of a first modification of the embodiment. In the aforementioned embodiment, the sidewall portions 19b formed on the sides of the mask portions 16a are removed after the memory cell gate structures 101 and the select gate structures 102 have been formed by anisotropic etching in the process of FIG. 9; however, in this modification, the sidewall portions 19b are not removed. In this case, the sides of the sidewall portions 19b incline as shown in FIG. 11. Therefore, even if the sidewall portions 19b are left unremoved, the interlayer insulating film 23 can be formed easily and reliably between the select gate structures 102. Accordingly, this modification will also provide the same advantages as the aforementioned embodiment.

Figure 12:
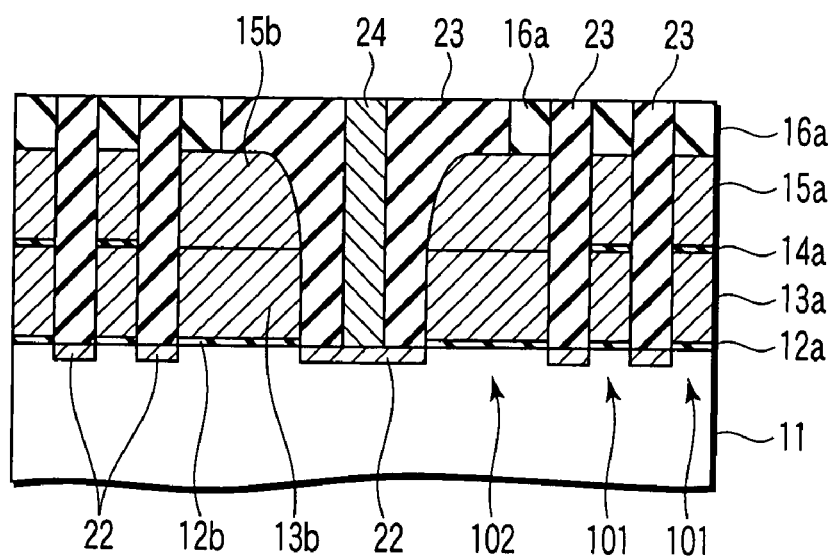
FIG. 12 is a schematic sectional view of a semiconductor device according to a second modification of the embodiment of the present invention.

FIG. 12 is a schematic sectional view of a second modification of the embodiment. In the aforementioned embodiment, the insulating portion 14b is formed between the first and second gate portions 13b and 15b of each of the select gate structures 102 as shown in FIG. 10; however, in this modification, the insulating portion 14b is not formed. Such a structure can be obtained simply by increasing the width of the through holes which are to be formed in the interelectrode insulating film 14 in the process of FIG. 3. This modification will also offer the same advantages as the aforementioned embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a stacked structure in which a first gate insulating film, a first gate electrode film, a second gate insulating film and a second gate electrode film are stacked in this order, on a semiconductor substrate;
    forming a plurality of mask portions separate from each other on the stacked structure at the same pitch;
    removing at least one mask portion formed in a predetermined area with mask portions left in areas between which the predetermined area is interposed;
    forming sidewall portions on opposed side surfaces of a pair of mask portions which are opposed to each other with the predetermined area interposed therebetween; and
    etching the stacked structure using the mask portions and the sidewall portions as a mask to form a pair of select gate structures under the pair of mask portions and the sidewall portions and form memory cell gate structures under mask portions other than the pair of mask portions.

2. The method according to claim 1, wherein each of the sides of the sidewall portions is inclined.

3. The method according to claim 1, wherein the select gate structures have sides which are opposed to each other and at least the upper portion of each of the opposed sides of the select gate structures is inclined.

4. The method according to claim 3, wherein each of the select gate structures has another side which is opposite said opposed side, and said another side is substantially vertical to a major surface of the semiconductor substrate.

5. The method according to claim 1, further comprising forming an interlayer insulating film between the select gate structures.

6. The method according to claim 5, further comprising forming a contact plug in the interlayer insulating film.

7. The method according to claim 1, wherein forming the sidewall portions includes forming a covering film covering the stacked structure and the mask portions, and anisotropically etching the covering film.

8. The method according to claim 7, wherein the covering film is left between adjacent mask portions in anisotropically etching the covering film.

9. The method according to claim 7, further comprising forming a photoresist pattern covering the sidewall portions, and removing the covering film left between the adjacent mask portions using the photoresist pattern as a mask.

10. The method according to claim 1, wherein the second gate insulating film has a through hole, and a part of the second gate electrode film is formed in the through hole.

11. The method according to claim 1, wherein the semiconductor device has a NAND type memory structure including the select gate structures and the memory cell gate structures.

12. The method according to claim 1, wherein the select gate structure is greater in width than the memory cell gate structure.

13. The method according to claim 1, wherein a spacing between the select gate structure and the memory cell gate structure which are adjacent to each other is equal to a spacing between the memory cell gate structures which are adjacent to each other.

14. The method according to claim 1, wherein forming the plurality of mask portions includes forming a mask film on the stacked structure, forming a plurality of photoresist patterns on the mask film at the same pitch by means of photolithography, and etching the mask film using the photoresist patterns as a mask.

15. The method according to claim 1, further comprising removing the sidewall portions after etching the stacked structure.

* * * * *